(12) United States Patent
Plett

(10) Patent No.: US 8,918,299 B2
(45) Date of Patent: Dec. 23, 2014

(54) SYSTEM AND METHOD FOR MAXIMIZING A BATTERY PACK TOTAL ENERGY METRIC

(75) Inventor: Gregory L. Plett, Colorado Springs, CO (US)

(73) Assignee: American Electric Vehicles, Inc., Palmer Lake, CO (US)

( * ) Notice: Subject to any disclaimer, the term of this patent is extended or adjusted under 35 U.S.C. 154(b) by 1036 days.

(21) Appl. No.: 12/956,936

(22) Filed: Nov. 30, 2010

(65) Prior Publication Data

US 2011/0130986 A1    Jun. 2, 2011

Related U.S. Application Data

(60) Provisional application No. 61/283,325, filed on Dec. 2, 2009.

(51) Int. Cl.
   *G01R 31/36* (2006.01)
   *H01M 10/48* (2006.01)

(52) U.S. Cl.
   CPC ............ *H01M 10/48* (2013.01); *G01R 31/362* (2013.01)
   USPC ........................................................ 702/63

(58) Field of Classification Search
   None
   See application file for complete search history.

(56) References Cited

U.S. PATENT DOCUMENTS

| | | |
|---|---|---|
| 5,789,924 A | 8/1998 | Okada |
| 6,534,954 B1 | 3/2003 | Plett |
| 6,892,148 B2 | 5/2005 | Barsoukov et al. |
| 7,193,392 B2 * | 3/2007 | King et al. ............. 320/118 |
| 7,315,789 B2 | 1/2008 | Plett |
| 7,321,220 B2 | 1/2008 | Plett |
| 7,400,115 B2 | 7/2008 | Plett |
| 7,446,504 B2 | 11/2008 | Plett |
| 7,521,895 B2 | 4/2009 | Plett |
| 7,525,285 B2 | 4/2009 | Plett |
| 7,589,532 B2 | 9/2009 | Plett |
| 7,593,821 B2 | 9/2009 | Plett |
| 7,656,122 B2 | 2/2010 | Plett |
| 7,656,123 B2 | 2/2010 | Plett |
| 7,723,957 B2 | 5/2010 | Plett |
| 7,800,375 B2 | 9/2010 | Plett |
| 7,884,613 B2 | 2/2011 | Plett |
| 7,893,694 B2 | 2/2011 | Plett |
| 8,339,100 B2 * | 12/2012 | Li et al. ............... 320/118 |
| 8,344,694 B2 * | 1/2013 | Zhang et al. ............ 320/118 |
| 2006/0100833 A1 | 5/2006 | Plett |

(Continued)

OTHER PUBLICATIONS

Moore et al., A Review of Cell Equalization Methods for Lithium Ion and Lithium Polymer Battery Systems, 2001 Society of Automotive Engineers, Inc.

(Continued)

*Primary Examiner* — Aditya Bhat
(74) *Attorney, Agent, or Firm* — McDonnell Boehnen Hulbert & Berghoff LLP.

(57) ABSTRACT

A system and method for maximizing a battery pack total energy metric indicative of a total energy of a battery pack is provided. The method includes receiving battery cell charge capacity estimates for all cells in the battery pack, composing battery pack configurations comprising subsets of the totality of battery cells, evaluating a battery pack energy metric for every battery pack configuration that is composed, selecting the battery pack configuration that has the maximum battery pack energy metric, and storing values indicative of the selected battery pack configuration in a memory.

13 Claims, 4 Drawing Sheets

(56) References Cited

U.S. PATENT DOCUMENTS

| | | |
|---|---|---|
| 2008/0249725 A1 | 10/2008 | Plett |
| 2009/0189613 A1 | 7/2009 | Plett |
| 2010/0174500 A1 | 7/2010 | Plett |
| 2010/0191491 A1 | 7/2010 | Plett |

OTHER PUBLICATIONS

Plett, Gregory L., "Recursive Approximate Weighted Total Least Squares Estimation of Battery Cell Total Capacity," Journal of Power Sources 196 (2011) 2319-31.

Plett, Gregory L., "Battery Management System Algorithms for HEV battery state-of-charge and state-of-health estimation," Advanced Materials and Methods for Lithium-Ion Batteries, 2007.

Plett, Gregory L., Sigma-point Kalman filtering for battery management systems of LiPB-based HEV battery packs Part 1: Introduction and state estimation, 2006.

Plett, Gregory L., "Sigma-point Kalman filtering for battery management systems of LiPB-based HEV battery packs Part 2: Simultaneous state and parameter estimation" Journal of Power Sources 161 (2006) 1369-84.

Plett, Gregory L., "High-Performance Battery-Pack Power Estimation Using a Dynamic Cell Model," IEEE Transactions on Vehicular Technology, vol. 53, No. 5, Sep. 2004.

Plett, Gregory L., Extended Kalman filtering for battery managment systems of LiPB-based HEV battery packs Part 1. Background, Journal of Power Sources 134 (2004) 252-261.

Plett, Gregory L., "Extended Kalman filtering for battery management systems of LiPB-based HEV battery packs Part 2. Modeling and identification" Journal of Power Sources 134 (2004) 262-276.

Plett, Gregory L., "Extended Kalman filtering for battery management systems of LiPB-based HEV battery packs Part 3. State and parameter estimation" Journal of Power Sources 134 (2004) 277-292.

* cited by examiner

SYSTEM AND METHOD FOR MAXIMIZING A BATTERY PACK TOTAL ENERGY METRIC

RELATED APPLICATIONS

This applications claims priority to U.S. Provisional Application Ser. No. 61/283,325 filed Dec. 2, 2009, the disclosure of which is hereby incorporated by reference.

FIELD OF THE APPLICATION

This application relates generally to battery cells that can be used in electric vehicles, and more particularly to a method and system for maximizing a battery pack total energy metric.

BACKGROUND

Battery cells are used in a wide variety of electronic and electrical devices. Very often, individual battery cells are connected electrically in series to form battery packs having higher total voltage and higher total energy capacity than individual battery cells. One consequence of connecting battery cells in series is that all of the battery cells will experience the same electrical current. Therefore, the number of ampere-hours added or subtracted from every battery cell's charge level will be the same. However, individual battery cells may have different charge capacity (in ampere hours). This is particularly true as the battery pack ages, because over time individual battery cells degrade: battery cell resistances tend to increase and battery cell charge capacities tend to decrease. If this process occurs at different rates in different battery cells in a battery pack, then at some point in time one or more battery cells may limit the battery pack total energy capacity. A battery cell having lower charge capacity is more quickly charged to the maximum design voltage, and is more quickly discharged to the minimum design voltage. Therefore, either not all battery cells will be fully charged when the battery cell having lower charge capacity is charged, or not all battery cells will be fully discharged when the battery cell having lower charge capacity is discharged. Not all of the possible energy capacity of the battery pack will be realized.

At some point, a battery pack may be capable of higher total energy capacity if one or more of the battery cells having low charge capacity are removed from the battery pack so that they no longer limit the range of charge of the other battery cells. In some applications, these battery cells might be replaced with new battery cells. In other applications, that might not be practical, so the battery controller could then allow those battery cells to be abandoned—the lower voltage of these particular battery cells would no longer be restricted by the controller to the lower design voltage. This "undercharge condition" for some battery cell electro-chemistries causes the battery cell voltage to collapse to zero and the battery cell charge capacity to collapse to zero, effectively eliminating that battery cell from the battery pack without physically removing it. This is a safe operating condition, and can result in higher overall battery pack energy capacity.

While abandoning a battery cell in this manner can result in higher overall battery pack energy capacity, it will also place greater stresses on the remaining battery cells in the battery pack, since they must provide greater power levels per battery cell than they did before. Therefore, in some applications it may be desirable to optimize the battery pack total energy capacity. Battery pack total energy capacity is one possible battery pack total energy metric. In other applications it may be desirable to optimize a different battery pack total energy metric that takes into account the total energy capacity and stress factors on remaining battery cells when some battery cells are abandoned.

Accordingly, there is a need for a method for efficiently determining a battery pack configuration based on present battery cell charge capacities that maximizes a battery pack total energy metric. The embodiments disclosed herein perform this task.

BRIEF DESCRIPTION OF THE EMBODIMENTS

A method for maximizing a battery pack total energy metric in accordance with an exemplary embodiment is provided. The method includes receiving battery cell charge capacity estimates for all battery cells in the battery pack, and computing a battery pack total energy metric for zero or more of the battery cells having lowest charge capacity removed from consideration. The method further includes determining the configuration that results in a maximum battery pack total energy metric, and storing that configuration in a memory.

A system for maximizing a battery pack total energy metric in accordance with an exemplary embodiment is provided. The system includes a subsystem configured to receive battery cell charge capacity estimates for all battery cells in the battery pack, and a subsystem configured to compute a battery pack total energy metric for zero or more of the battery cells having lowest charge capacity removed from consideration. The system is further configured to determine the configuration that results in a maximum battery pack total energy metric, and store that configuration in a memory.

A computer readable medium having computer-executable instructions for performing a method for maximizing a battery pack total energy metric in accordance with an exemplary embodiment is provided. The method includes receiving battery cell charge capacity estimates for all battery cells in the battery pack, and computing a battery pack total energy metric for zero or more of the battery cells having lowest charge capacity removed from consideration. The method further includes determining the configuration that results in a maximum battery pack total energy metric, and storing that configuration in a memory.

DETAILED DESCRIPTION

Figure 1:
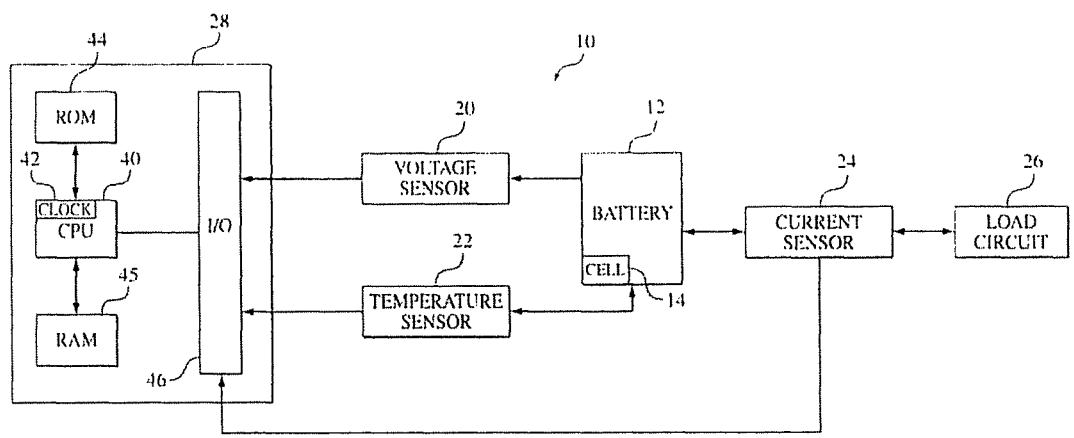
FIG. 1 is a schematic of a system for maximizing a battery pack total energy metric in accordance with an exemplary embodiment.

The charge capacity of a battery cell is a value, usually expressed in ampere hours (Ah) or milliampere hours (mAh), that indicates the maximum electrical charge that the battery cell is capable of holding. New battery cells are manufactured with certain nominal charge capacities, but as the battery cells age, their charge capacities generally decrease.

When charging a battery cell, care must be taken so that its voltage does not exceed some maximum design voltage. When discharging a battery cell, care must be taken so that its voltage does not go below some minimum design voltage. For many battery cell electrochemical compositions, an over-voltage condition is a potential safety issue, and can cause fire or explosion. An under-voltage condition, while not a safety concern, can cause the battery cell to develop permanent degradation in charge capacity.

Battery packs are often made by connecting individual battery cells in series to obtain higher total voltage and higher total energy storage capacity. One consequence of individual battery cells connected in series is that all battery cells so connected will experience the same electrical current and the number of ampere-hours added or subtracted from each individual battery cell charge level will be the same. However, since the battery cells will have different individual charge capacities, one or more battery cells may limit the battery pack total energy capacity. A battery cell having lower charge capacity than others in the battery pack is more quickly charged to the maximum design voltage, and is more quickly discharged to the minimum design voltage. Therefore, to maintain battery pack safety, not all battery cells will be fully charged when the battery cell having lowest charge capacity is fully charged, or not all battery cells will be fully discharged when the battery cell having lowest charge capacity is fully discharged. Not all of the possible energy capacity of the battery pack will be realized unless all charge capacities are identical and the pack is perfectly balanced.

At some point, a battery pack may be capable of higher total energy capacity if one or more of the battery cells having low charge capacity are removed from the pack so that they no longer limit the range of charge of the other battery cells. In some applications, these battery cells might be replaced with new battery cells. In other applications, that might not be practical, so the battery controller could then allow those battery cells to be abandoned. Abandoning a battery cell means that that particular battery cell is ignored for the purposes of computing which battery cells to equalize, when determining maximum discharge power or energy, and when controlling the battery pack charging process (except inasmuch as safety issues are necessary to consider). That is, the lower voltage of these battery cells would no longer be restricted by the minimum design voltage during a discharge, and the battery cells' charge capacities would be allowed to collapse to zero (a short-circuit condition). This is a safe operating condition, and can result in higher overall battery pack energy capacity.

Therefore, in some applications it may be desirable to determine battery pack configurations that optimize the battery pack total energy capacity, possibly abandoning battery cells having low charge capacity. However, while abandoning a battery cell in this manner can result in higher overall battery pack energy capacity, it will also place greater stresses on the remaining battery cells in the battery pack, since they must provide greater power levels per battery cell than they did before. Therefore, in other applications it may be desirable to optimize a different battery pack total energy metric that takes into account the battery pack total energy capacity and stress factors on remaining battery cells when some battery cells are abandoned.

Accordingly, there is a need for a method for efficiently determining a battery pack configuration based on present battery cell charge capacities that maximizes a battery pack total energy metric. In some applications, this battery pack total energy metric may be equal to battery pack total energy; in other applications it may be equal to a modified function involving battery pack total energy. In every application, the goal is to maximize battery pack performance.

To describe how the present embodiments determine which battery cells are limiting battery pack performance, the battery cell state-of-charge (SOC) is first defined, which is a value between 0% and 100% that indicates the relative level of charge held by the battery cell. A state-of-charge of 100% corresponds to a "full" battery cell, while a state-of-charge of 0% corresponds to an "empty" battery cell. Knowing this, the total energy capacity (in Watt hours) of an individual battery cell can be computed as $$E = \int_{t_1}^{t_2} v(t)i(t)\,dt \qquad (1)$$
$$= C\int_{t_1}^{t_2} v(t)\frac{dz(t)}{dt}\,dt \approx$$
$$\approx C\int_{t_1}^{t_2} OCV(z)\,dt$$

where $v(t)$ is the battery cell voltage at time t, $i(t)$ is battery cell current at time t, C is the charge capacity of the battery cell (in ampere hours), $z_1$ is the lower design limit SOC value of the battery cell, $z_2$ is the upper design limit SOC of the battery cell, and $OCV(\ )$ is the open-circuit-voltage of the battery cell (in volts) as a function of SOC. (The second line of this equation relies on the relationship $dz/dt=i(t)/C$.) To compute battery cell energy, the battery cell charge capacity must be known, and the battery cell open-circuit-voltage function must be known. The battery cell open-circuit-voltage function is determined by the battery cell electrochemistry and may be measured using standard laboratory tests. Additionally, it may be stored in a table in pre-integrated form in order to quickly look-up the desired values.

Battery pack energy capacity can be computed in a similar way.

$$E = \int_{t_1}^{t_2}\left(\sum_k v_k(t)\right)i(t)\,dt \qquad (2)$$
$$= \sum_k \int_{t_1}^{t_2} v_k(t)i(t)\,dt$$
$$= \sum_k C_k \int_{t_1}^{t_2} v_k(t)\frac{dz_k(t)}{dt}\,dt$$
$$\approx \sum_k C_k \int_{z_{1,k}}^{z_{2,k}} OCV(z)\,dz$$

Equation (2) recognizes that the charge capacities of each battery cell will be different, so denotes individual charge capacity values as $C_k$ where k is the index of the battery cell, from 1 to the number of battery cells in series. At any point in time, the voltages and states-of-charge of each battery cell will also differ, so are individually denoted as $v_k(t)$ and $z_k(t)$, respectively. The upper and lower limits on SOC will also differ, so are denoted as $z_{2,k}$ and $z_{1,k}$, respectively. Battery pack total energy capacity will be maximized when all $z_{2,k}$ values are identical, since the open-circuit-voltage is an increasing function of SOC. Therefore, it is assumed that $z_{2,k}=z_2$ for all k. (This is not a requirement for the present invention, but makes the discussion simpler.) As the battery pack is discharged, the minimum $z_{1,k}$ may not go lower than $z_1$. If all battery cells begin at SOC level $z_2$, the first battery cell to reach the SOC level $z_1$ will be the battery cell with lowest charge capacity. Without loss of generality, assume that battery cells are sorted by index in terms of increasing charge capacity. That is, $C_1 \leq C_2 \leq C_3$. Therefore, it is concluded that $z_{1,1} = z_1$. The lower SOC limit for all other battery cells can be calculated by recognizing that the number of ampere-hours discharged from the battery cell with lowest charge capacity must be identical to the number of ampere-hours discharged from all other battery cells.

$$(z_2 - z_1)C_1 = (z_2 - z_{1,k})C_k \quad (3)$$

$$z_{1,k} = z_2 - (z_2 - z_1)\frac{C_1}{C_k},$$

Therefore, there is now the capability of calculating the total energy capacity of a series-connected battery pack:

1) Receive battery cell charge capacity estimates $C_k$ for all cells;
2) Determine the battery cell with lowest charge capacity, and label it as cell 1;
3) Compute all $z_{1,k}$ values using Equation (3); and
4) Compute battery pack energy using Equation (2).

Figure 2:
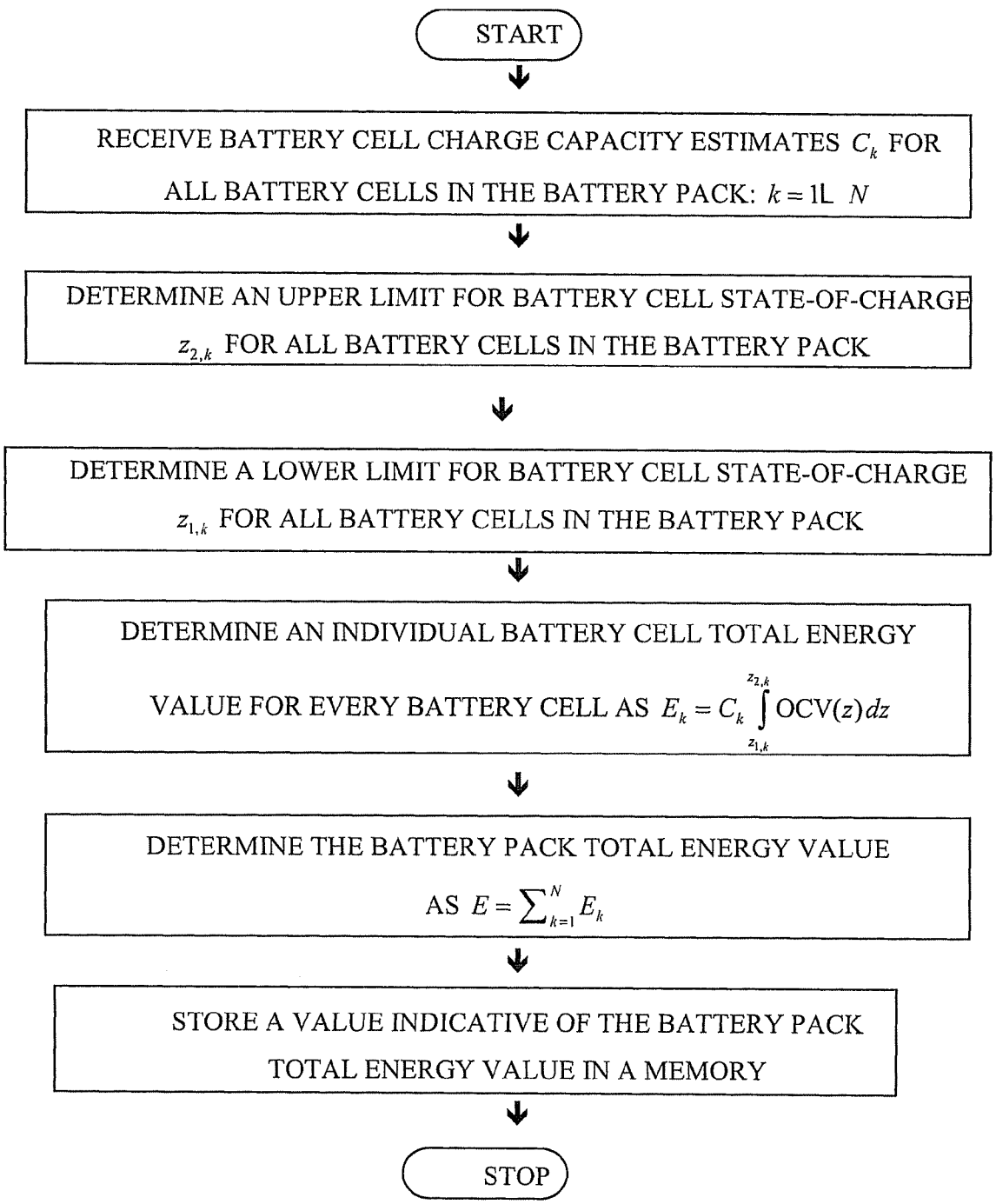
FIG. 2 is a block diagram of an exemplary computational algorithm utilized by the system of FIG. 1 to compute battery pack total energy.
Figure 3:
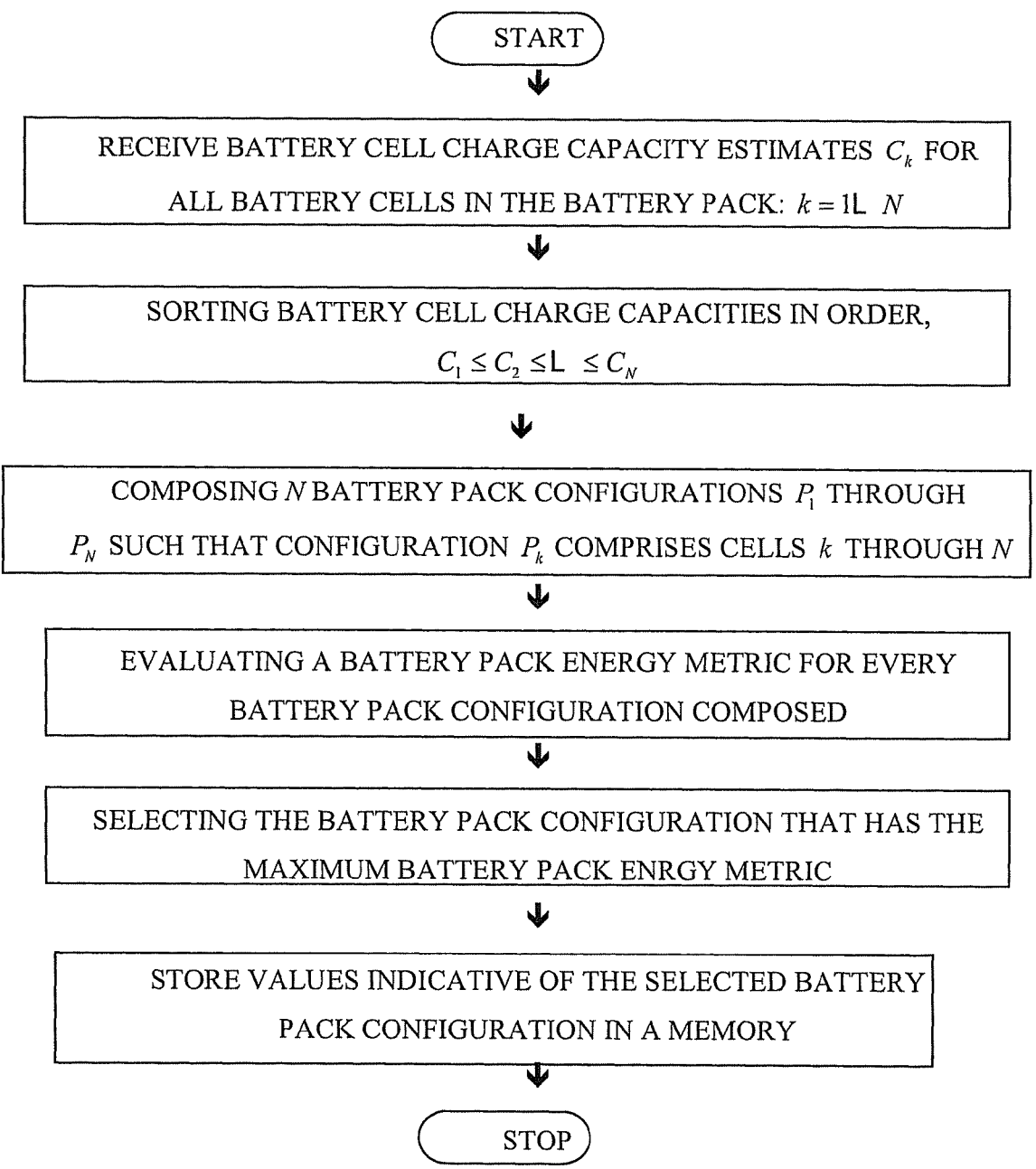
FIG. 3 is a block diagram of an exemplary computational algorithm utilized by the system of FIG. 1 to maximize a battery pack total energy metric.

FIG. 2 gives a flow-chart for this method.

Knowing how to compute battery pack total energy allows for the embodiment using a method for maximizing a battery pack total energy metric. An exemplary embodiment receives battery cell charge capacity estimates $C_k$ for all cells, computes a battery pack total energy metric for hypothetical battery packs comprising subsets of the full set of battery cells, and selects the configuration having the largest battery pack total energy metric.

In one exemplary embodiment, the battery pack total energy metric is selected to equal the battery pack total energy. The following steps are performed:

1) Receive battery cell charge capacity estimates for all battery cells;
2) Sort battery cell charge capacities in ascending order, indexed from 1 to N, where N is the number of battery cells. That is, $C_1 \leq C_2 \leq L \leq C_N$.
3) Define battery pack configuration $P_k$ to comprise battery cells k through N. That is, $P_1$ comprises all battery cells, $P_2$ comprises all battery cells except the one with lowest charge capacity, and so forth.
4) Compute the battery pack total energy $E_k$ using battery pack configuration $P_k$.
5) Select battery pack configuration with maximum value of $E_k$. Battery cells not included in this configuration are abandoned.

Figure 4:
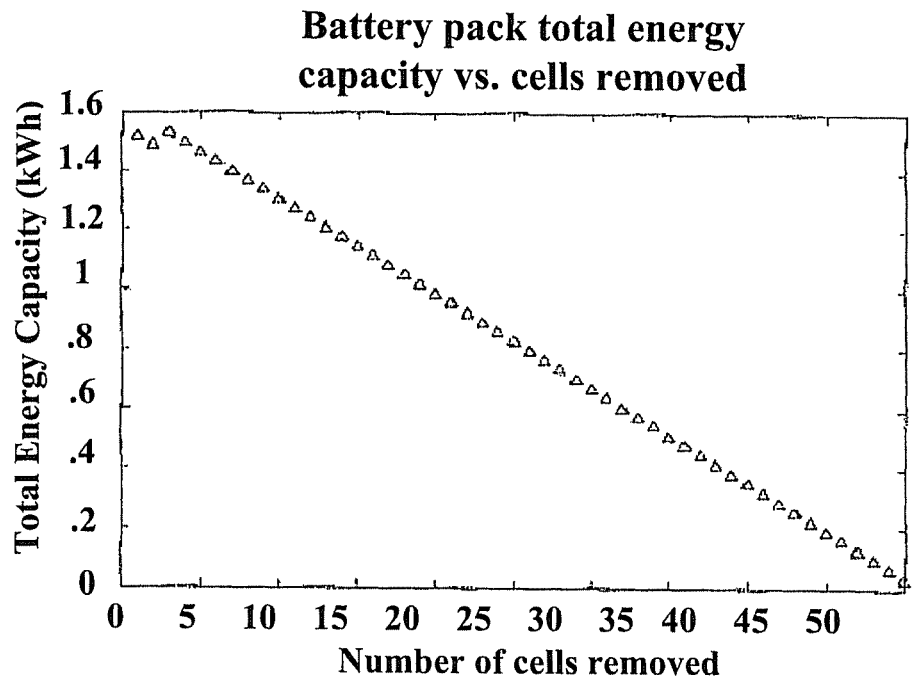
FIG. 4 is a result using an exemplary embodiment.

FIG. 4 shows results for this exemplary embodiment for a battery pack comprising 50 battery cells (a lithium-ion battery chemistry is assumed for the OCV function, but the method works for any battery chemistry). Forty-eight of these cells have a capacity of 10 ampere hours, and two of the cells have a capacity of 9.5 ampere hours. In this example, the battery pack total energy is maximized if the two low-capacity battery cells are abandoned, and the pack is assumed to operate using only the remaining forty-eight battery cells.

Battery pack total energy might not be the only metric that is desired to be optimized. For example, by abandoning certain battery cells, greater stress is put on the remaining battery cells in the pack, potentially decreasing their lifetimes. An alternate embodiment optimizes a different battery pack total energy metric. The method receives battery cell charge capacity estimates $C_k$ for all battery cells, computes a different battery pack total energy metric $ME_k$ for a hypothetical battery pack comprising subsets of the full set of battery cells, and selects the configuration having the largest modified battery pack total energy metric.

In one exemplary embodiment, the following steps are performed:

1) Receive battery cell charge capacity estimates for all battery cells;
2) Sort battery cell charge capacities in ascending order, indexed from 1 to N, where N is the number of battery cells. That is, $C_1 \leq C_2 \leq L \leq C_N$.
3) Define battery pack configuration $P_k$ to comprise battery cells k through N. That is, $P_1$ comprises all battery cells, $P_2$ comprises all battery cells except the one with lowest charge capacity, and so forth.
4) Compute the battery pack total energy metric $ME_k$ using battery pack configuration $P_k$.
5) Select battery pack configuration with maximum value of $ME_k$. Battery cells not included in this configuration are abandoned.

Figure 5:
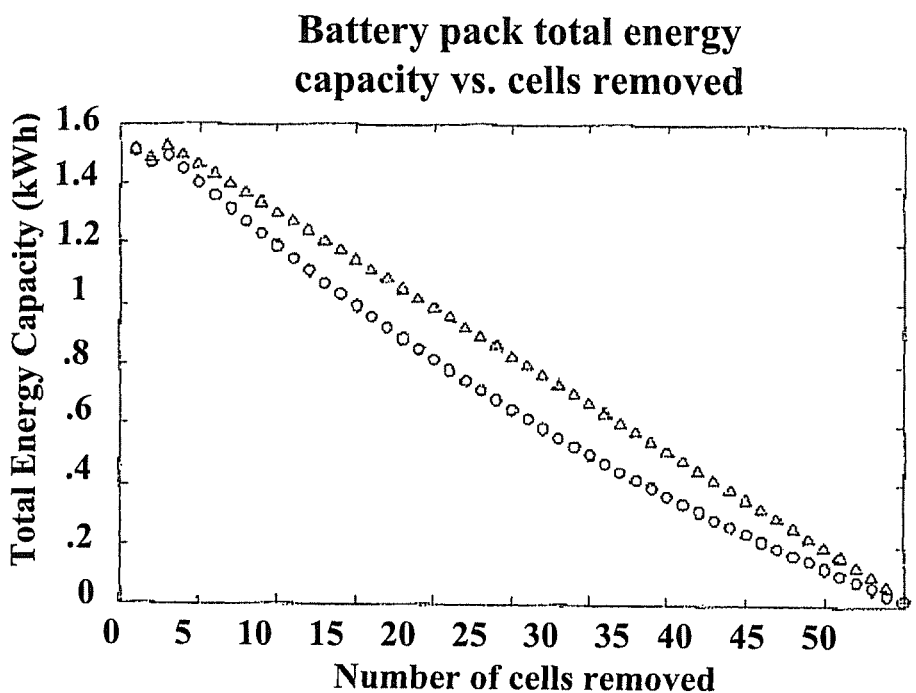
FIG. 5 is a result using an exemplary embodiment.

FIG. 5 shows results for this exemplary embodiment for a battery pack comprising 50 battery cells (a lithium-ion battery chemistry is assumed for the OCV function, but the method works for any battery chemistry). Forty-eight of these battery cells have a capacity of 10 ampere hours, and two of the battery cells have a capacity of 9.5 ampere hours. The battery pack total energy metric in this exemplary embodiment is $ME_k = 0.99^k E_k$. This performance metric penalizes removing cells, such that they will be abandoned only if it significantly increases the battery pack total energy. In the figure, the unmodified energy function $E_k$ is plotted as triangles, and the modified energy function $ME_k$ is plotted as circles. In this example, the modified battery pack total energy is maximized by retaining all of the fifty battery cells and abandoning none of the battery cells.

The system and method for maximizing a battery pack total energy metric provides a substantial advantage over other systems and methods. In particular, the system and method provide a technical effect of accurately determining an optimal battery pack configuration that maximizes a battery pack total energy metric that is computationally efficient to compute, and can take into account battery cell lifetime stresses while maximizing battery pack total energy.

The above-described methods can be embodied in the form of computer program code containing instructions embodied in tangible media, such as floppy diskettes, CD ROMs, hard drives, or any other computer-readable storage medium, wherein, when the computer program code is loaded into and executed by a computer, the computer becomes an apparatus for practicing the invention. The above-described methods can also be embodied in the form of computer program code, for example, whether stored in a storage medium, loaded into and/or executed by a computer, or transmitted over some transmission medium, loaded into and/or executed by a computer, or transmitted over some transmission medium, such as over electrical wiring or cabling, through fiber optics, or via electromagnetic radiation, wherein, when the computer program code is loaded into an executed by a computer, the computer becomes an apparatus for practicing the methods. When implemented on a general-purpose microprocessor, the computer program code segments configure the microprocessor to create specific logic circuits.

While the invention is described with reference to exemplary embodiments, it will be understood by those skilled in the art that various changes may be made and equivalent elements may be substituted for elements thereof without departing from the scope of the invention. In addition, many modifications may be made to the teachings of the invention to adapt to a particular situation without departing from the scope thereof. Therefore, it is intended that the invention not be limited to the embodiments disclosed herein, but that the invention include all embodiments falling with the scope of the appended claims.

What is claimed is:

1. A method for maximizing a battery pack total energy metric for a battery pack comprising N battery cells, the method comprising:
   receiving a battery cell charge capacity estimate indicative of a charge capacity of a battery cell for all battery cells in the battery pack;
   composing battery pack configurations comprising subsets of the total N battery cells;
   evaluating a battery pack energy metric for every battery pack configuration that is composed;
   selecting the battery pack configuration that has the maximum battery pack energy metric;
   abandoning any battery cells that are not included in the battery pack configuration that has the maximum battery pack energy metric; and
   storing values representing the selected battery pack configuration in a memory.

2. The method of claim 1, wherein composing battery pack configurations comprising subsets of the total N battery cells comprises:
   sorting battery cell charge capacities in order from 1 to N; and
   composing N different battery pack configurations denoted $P_k$ for k=1 through N, such that configuration $P_k$ comprises battery cells k through N.

3. The method of claim 1, wherein the battery pack energy metric is defined to be the battery pack total energy of the configuration being evaluated.

4. The method of claim 1 wherein the battery pack energy metric is defined to be a function of the number of cells in the configuration being evaluated multiplied by the battery pack total energy of the configuration being evaluated.

5. The method of claim 1, wherein the step of composing battery pack configurations comprising subsets of the total N battery cells is performed by selecting a first subset that includes all battery cells in the battery pack, a second subset that includes all batteries cells in the battery pack except the battery cell having the lowest charge capacity, and a third subset that includes all battery cells in the second subset except the battery cell having the next lowest charge capacity.

6. The method of claim 5, wherein each subsequent subset of the total N battery cells includes all of the battery cells in the prior subset except the battery cell having the next lowest charge capacity.

7. The method of claim 1, wherein the step of abandoning a battery cell means that an abandoned battery cell is ignored for the purposes of computing which battery cells to equalize, when determining a maximum discharge power or energy, and when controlling the battery pack charging process, except for consideration of safety issues.

8. The method of claim 1, wherein the step of abandoning a battery cell means that the lower voltage of an abandoned battery cell is not restricted by a minimum design voltage during discharge and a charge capacity of the abandoned battery is allowed to collapse to zero.

9. A system for maximizing a battery pack total energy metric for a battery pack comprising N battery cells, the system comprising:
   a computer configured to receive a battery cell charge capacity estimate indicative of a charge capacity of a battery cell for all battery cells in the battery pack;
   the computer further configured to compose battery pack configurations comprising subsets of the total N battery cells;
   the computer further configured to evaluate a battery pack energy metric for every battery pack configuration that is composed;
   the computer further configured to select the battery pack configuration that has the maximum battery pack energy metric;
   the computer further configured to abandon battery cells that are not included in the battery pack configuration that has the maximum battery pack energy metric; and
   the computer further configured to store values representing the selected battery pack configuration in a memory.

10. The system of claim 9, wherein the computer is further configured to compose battery pack configurations comprising subsets of the total N battery cells by selecting a first subset that includes all battery cells in the battery pack, a second subset that includes all batteries cells in the battery pack except the battery cell having the lowest charge capacity, and a third subset that includes all battery cells in the second subset except the battery cell having the next lowest charge capacity.

11. The system of claim 10, wherein each subsequent subset of the total N battery cells includes all of the battery cells in the prior subset except the battery cell having the next lowest charge capacity.

12. The system of claim 9, wherein an abandoned battery cell means that the abandoned battery cell is ignored for the purposes of computing which battery cells to equalize, when determining a maximum discharge power or energy, and when controlling the battery pack charging process, except for consideration of safety issues.

13. The system of claim 9, wherein an abandoned battery cell means that a lower voltage of the abandoned battery cell is not restricted by a minimum design voltage during discharge and a charge capacity of the abandoned battery cell is allowed to collapse to zero.

* * * * *